US009385758B2

(12) United States Patent
Lim et al.

(10) Patent No.: US 9,385,758 B2
(45) Date of Patent: Jul. 5, 2016

(54) SYSTEMS AND METHODS FOR EFFICIENT TARGETED SYMBOL FLIPPING (71) Applicant: LSI Corporation, San Jose, CA (US)

(72) Inventors: Yu Chin Fabian Lim, San Jose, CA (US); Shaohua Yang, San Jose, CA (US); Kaitlyn T. Nguyen, San Jose, CA (US); Zuo Qi, Milpitas, CA (US); Ku Hong Jeong, San Jose, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 92 days.

(21) Appl. No.: 14/159,523

(22) Filed: Jan. 21, 2014

(65) Prior Publication Data

US 2015/0188576 A1 Jul. 2, 2015

Related U.S. Application Data (60) Provisional application No. 61/922,902, filed on Jan. 2, 2014.

(51) Int. Cl.
H03M 13/00 (2006.01)
H03M 13/45 (2006.01)

(52) U.S. Cl.
CPC .................................. *H03M 13/458* (2013.01)

(58) Field of Classification Search
CPC ..................................................... H03M 13/458
See application file for complete search history.

(56) References Cited

U.S. PATENT DOCUMENTS

| 5,701,314 | A | 12/1997 | Armstrong |
| 5,712,861 | A | 1/1998 | Inoue |
| 5,797,020 | A | 8/1998 | Bonella et al. |
| 6,157,510 | A | 12/2000 | Schreck et al. |
| 6,185,620 | B1 | 2/2001 | Weber et al. |
| 6,405,342 | B1 | 6/2002 | Lee |
| 6,438,717 | B1 | 8/2002 | Butler |
| 6,657,803 | B1 | 12/2003 | Ling |
| 7,076,719 | B2 | 7/2006 | Anjo et al. |
| 7,136,244 | B1 | 11/2006 | Rothberg |
| 7,154,690 | B1 | 12/2006 | Brunnett et al. |
| 7,685,467 | B2 | 3/2010 | Mandal et al. |
| 7,702,989 | B2 | 4/2010 | Graef |
| 7,730,384 | B2 | 6/2010 | Graef |
| 7,738,201 | B2 | 6/2010 | Jin |
| 7,760,455 | B2 | 7/2010 | Kang et al. |
| 7,971,125 | B2 | 6/2011 | Graef |
| 7,990,642 | B2 | 8/2011 | Lee |
| 8,041,998 | B2 | 10/2011 | Mandal et al. |

(Continued)

FOREIGN PATENT DOCUMENTS

| EP | 2242054 A2 | 10/2010 |
| WO | WO 2008/087042 A1 | 7/2008 |
| WO | WO 2011/091845 A1 | 8/2011 |

OTHER PUBLICATIONS

Chase, D, "A Class of Algorithms for Decoding Block Codes with Channel Measurement Information" IEEE Transactions on Info theory, vol. 18, No. 1 Jan. 1, 1972.

(Continued)

*Primary Examiner* — Bryce Bonzo
*Assistant Examiner* — Thien D Nguyen (57) ABSTRACT

Systems and method relating generally to data processing, and more particularly to systems and methods for modifying symbols in a data set prior to re-processing.

20 Claims, 6 Drawing Sheets

(56) References Cited

U.S. PATENT DOCUMENTS

| | | | |
|---|---|---|---|
| 8,176,404 | B2 | 5/2012 | Yang |
| 8,443,251 | B1 | 5/2013 | Zhang et al. |
| 2009/0046385 | A1 | 2/2009 | Yamamoto |
| 2009/0132894 | A1* | 5/2009 | Xu et al. ............ 714/780 |
| 2009/0132897 | A1* | 5/2009 | Xu et al. ............ 714/796 |
| 2009/0187813 | A1* | 7/2009 | Haratsch ............ 714/795 |
| 2009/0310249 | A1 | 12/2009 | Michinaga |
| 2011/0080211 | A1 | 4/2011 | Yang |
| 2011/0161633 | A1 | 6/2011 | Xu |
| 2011/0264980 | A1 | 10/2011 | Li |
| 2011/0320902 | A1* | 12/2011 | Gunnam ............ 714/752 |
| 2012/0198129 | A1 | 8/2012 | Van Aken et al. |
| 2012/0200954 | A1 | 8/2012 | Jin |
| 2012/0236429 | A1 | 9/2012 | Yang |

OTHER PUBLICATIONS

Dong-U Lee et al "Pilotless Frame Synchronization via LDPC Code Constraint Feedback" IEEE Comm. Letters, NJ, US vol. 11 No. 8, Aug. 1, 2007.

Olmos et al., "Tree-Structure Expectation Propagation for LDPC Decoding in Erasure Channels", Cornell University Library arXiv:1009.4287 (Sep. 22, 2010).

U.S. Appl. No. 13/644,589, filed Oct. 4, 2012, Shaohua Yang, Unpublished.

U.S. Appl. No. 13/465,214, filed May 7, 2012, Chung-Li Wang, Unpublished.

U.S. Appl. No. 13/483,982, filed May 30, 2012, Yang Han, Unpublished.

U.S. Appl. No. 13/445,858, filed Apr. 12, 2012, Johnson Yen, Unpublished.

U.S. Appl. No. 13/490,849, filed Jun. 7, 2012, Johnson Yen, Unpublished.

U.S. Appl. No. 13/560,737, filed Jul. 27, 2012, Weijun Tan, Unpublished.

U.S. Appl. No. 13/602,440, filed Sep. 4, 2012, Fan Zhang, Unpublished.

U.S. Appl. No. 13/326,363, filed Dec. 15, 2011, Fan Zhang, Unpublished.

U.S. Appl. No. 13/459,282, filed Apr. 30, 2012, Fan Zhang, Unpublished.

U.S. Appl. No. 14/080,935, filed Nov. 15, 2013, Shu Li, Unpublished.

U.S. Appl. No. 13/474,672, filed May 17, 2012, Fan Zhang, Unpublished.

U.S. Appl. No. 13/412,492, filed Mar. 5, 2012, Shaohua Yang, Unpublished.

U.S. Appl. No. 13/326,367, filed Dec. 15, 2011, Shaohua Yang, Unpublished.

U.S. Appl. No. 13/372,600, filed Feb. 14, 2012, Shaohua Yang, Unpublished.

U.S. Appl. No. 13/869,862, filed Apr. 24, 2013, Fan Zhang, Unpublished.

U.S. Appl. No. 13/802,627, filed Mar. 13, 2013, Shaohua Yang, Unpublished.

U.S. Appl. No. 13/770,030, filed Feb. 19, 2013, Chung-Li Wang, Unpublished.

U.S. Appl. No. 13/692,908, filed Dec. 3, 2012, Fan Zhang, Unpublished.

U.S. Appl. No. 13/644,542, filed Oct. 4, 2012, Shaohua Yang, Unpublished.

* cited by examiner

SYSTEMS AND METHODS FOR EFFICIENT TARGETED SYMBOL FLIPPING

CROSS REFERENCE TO RELATED APPLICATIONS

The present application claims priority to (is a non-provisional of) U.S. Pat. App. No. 61/922,902 entitled "Systems and Methods for Efficient Targeted Symbol Flipping", and filed Jan. 2, 2014 by Lim et al. The entirety of the aforementioned provisional patent application is incorporated herein by reference for all purposes.

FIELD OF THE INVENTION

Systems and method relating generally to data processing, and more particularly to systems and methods for modifying symbols in a data set prior to re-processing.

BACKGROUND

Data transfer devices typically include data encoding and decoding circuitry to aid in the process of transferring and recovering data. In some cases, the encoding and decoding do not result in recovering the original data set. Hence, for at least the aforementioned reasons, there exists a need in the art for advanced systems and methods for data processing.

SUMMARY

Systems and method relating generally to data processing, and more particularly to systems and methods for modifying symbols in a data set prior to re-processing.

Various embodiments of the present invention provide data processing systems that include a data processing circuit and a retry control circuit. The data processing circuit is operable to apply a data processing algorithm to a data input to yield a decoded output. The decoded output includes a number of symbols, and each of the symbols include at least a first soft data value associated with a first bit combination and a second soft data value associated with a second bit combination. The retry control circuit is operable to: determine a reduced subset of the first bit combination and the second bit combination for a selected symbol based at least in part on the first soft data value and the second soft data value; and cause re-application of the data processing algorithm to the data input guided by the decoded output modified to include one of the reduced subset of the first bit combination or the second bit combination.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Systems and method relating generally to data processing, and more particularly to systems and methods for modifying symbols in a data set prior to re-processing.

Various embodiments of the present invention provide data processing systems that include a data processing circuit and a retry control circuit. The data processing circuit is operable to apply a data processing algorithm to a data input to yield a decoded output. The decoded output includes a number of symbols, and each of the symbols include at least a first soft data value associated with a first bit combination and a second soft data value associated with a second bit combination. The retry control circuit is operable to: determine a reduced subset of the first bit combination and the second bit combination for a selected symbol based at least in part on the first soft data value and the second soft data value; and cause re-application of the data processing algorithm to the data input guided by the decoded output modified to include one of the reduced subset of the first bit combination or the second bit combination. In some cases, the data processing systems are implemented as part of an integrated circuit. In various cases, the data processing systems are implemented as part of a communication device. In other cases, the data processing systems are implemented as part of a communication device.

In some instances of the aforementioned embodiments, the selected symbol is connected to an unsatisfied parity check equation in the decoded output. In other instances of the aforementioned embodiments, the selected symbol is not connected to any unsatisfied parity check equation in the decoded output. In some such embodiments, the selected symbol is a first selected symbol, and the retry control circuit is further operable to: cause re-application of the data processing algorithm to the data input guided by the decoded output modified to include the one of the reduced subset of the first bit combination or the second bit combination, and modified to include any possible bit combination of a second selected symbol. In various cases, the second selected symbol is connected to an unsatisfied parity check equation in the decoded output. In one or more cases, re-application of the data processing algorithm is a first re-application of the data processing algorithm, and the retry control circuit is further operable to cause a second re-application of the data processing algorithm to the data input guided by the decoded output modified to include the one of the reduced subset of the first bit combination and the second bit combination, and modified to include another possible bit combination of the second selected symbol.

In one or more instances of the aforementioned embodiments, the retry control circuit includes a first comparator circuit and a second comparator circuit. In such instances, determining the reduced subset of the first bit combination and the second bit combination for the selected symbol includes comparing the first soft data value against an upper threshold in the first comparator circuit and against a lower threshold in the second comparator circuit, and comparing the second soft data value against the upper threshold in the first comparator circuit and against the lower threshold in the second comparator circuit. In some cases, the first bit combination is included in the reduced subset of the first bit combination and the second bit combination when the first soft data is greater than the lower threshold and less than the upper threshold, and the second bit combination is excluded from the reduced subset of the first bit combination and the second bit combination when the second soft data is either greater than the upper threshold or less than the lower threshold. One or both of the upper threshold and the lower threshold are user programmable.

Other embodiments of the present invention provide methods for data processing that include applying a data processing algorithm to a data input by a data processing circuit to yield a decoded output. The decoded output includes a number of symbols, and each of the symbols includes at least a first soft data value associated with a first bit combination and a second soft data value associated with a second bit combination. The methods further include determining a reduced subset of the first bit combination and the second bit combination for a selected symbol based at least in part on the first soft data value and the second soft data value; and re-applying the data processing algorithm to the data input guided by the decoded output modified to include one of the reduced subset of the first bit combination or the second bit combination.

In some instances of the aforementioned embodiments, determining the reduced subset of the first bit combination and the second bit combination for the selected symbol includes: comparing the first soft data value against an upper threshold and against a lower threshold; and comparing the second soft data value against the upper threshold and against the lower threshold. In some cases, the first bit combination is included in the reduced subset of the first bit combination and the second bit combination when the first soft data is greater than the lower threshold and less than the upper threshold, and the first bit combination is excluded in the reduced subset of the first bit combination and the second bit combination when the first soft data is either greater than the upper threshold or less than the lower threshold.

In one or more instances of the aforementioned embodiments, the selected symbol is a first selected symbol, and the method further includes re-applying the data processing algorithm to the data input guided by the decoded output modified to include the one of the reduced subset of the first bit combination or the second bit combination, and modified to include any possible bit combination of a second selected symbol. In some cases, the first selected symbol is not connected to any unsatisfied parity check equation in the decoded output, and the second selected symbol is connected to an unsatisfied parity check equation in the decoded output.

Figure 1:
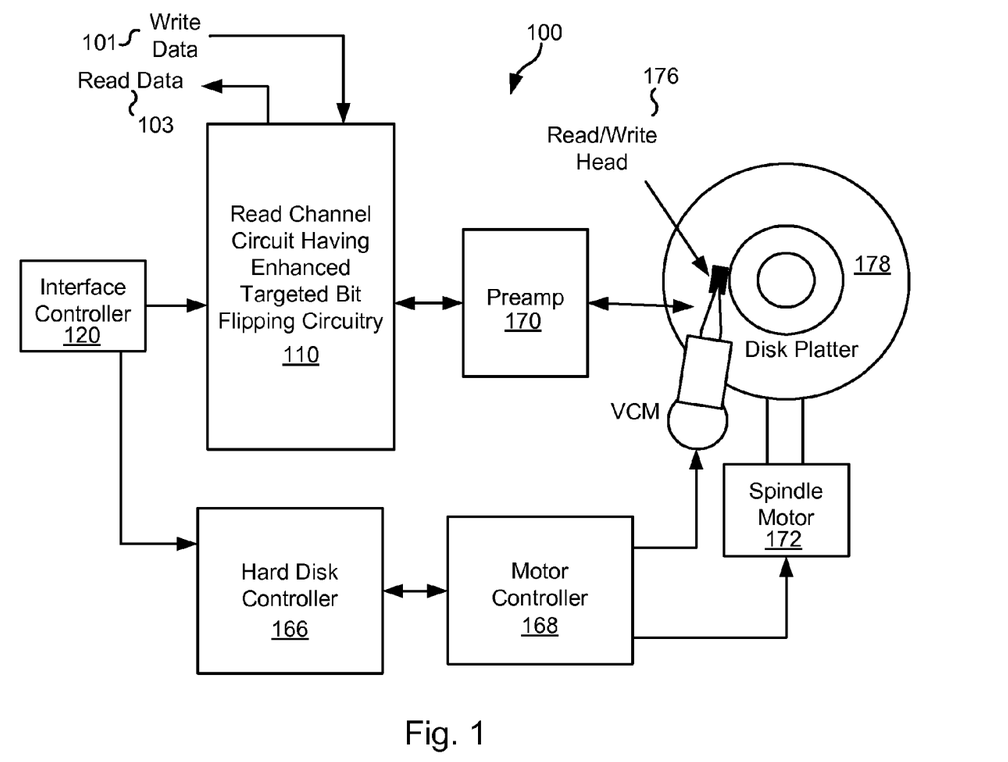
FIG. 1 shows a storage device including a read channel circuit having enhanced targeted bit flipping circuitry in accordance with various embodiments of the present invention.

Turning to FIG. 1, a storage system 100 is shown that includes a read channel 110 having enhanced targeted bit flipping circuitry in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178, and interacts with a host controller (not shown). The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head 176 is accurately positioned by motor controller 168 over a desired data track on disk platter 178. Motor controller 168 both positions read/write head 176 in relation to disk platter 178 and drives spindle motor 172 by moving read/write head assembly 176 to the proper data track on disk platter 178 under the direction of hard disk controller 166. Spindle motor 172 spins disk platter 178 at a determined spin rate (RPMs). Once read/write head 176 is positioned adjacent the proper data track, magnetic signals representing data on disk platter 178 are sensed by read/write head 176 as disk platter 178 is rotated by spindle motor 172. The sensed magnetic signals are provided as a continuous, minute analog signal representative of the magnetic data on disk platter 178. This minute analog signal is transferred from read/write head 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

In operation, data accessed from disk platter 178 is processed using a standard processing approach. Where the standard processing approach fails to converge (i.e., yield the originally stored data set), a retry process is performed. The retry process includes flipping symbols within a failed output to yield a modified output, and reprocessing the modified output using the standard processing approach. Initially, each possibility for each symbol connected to an unsatisfied check of the failed output is modified one at a time followed by reprocessing. Where this repeated reprocessing fails to converge, a subset of the possibilities for each symbol not connected to an unsatisfied check along with respective modifications of each possibility for each symbol connected to an unsatisfied check of the failed output are tried. This process continues until either the failed output converges, or all of the possible combinations of valid symbols unconnected with unsatisfied checks and symbols connected with unsatisfied checks are tested. The data processing circuit may be implemented similar to that discussed below in relation to FIGS. 4a-4b. The data processing may be completed using a method such as that discussed in relation to FIGS. 5a-5b and 6.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
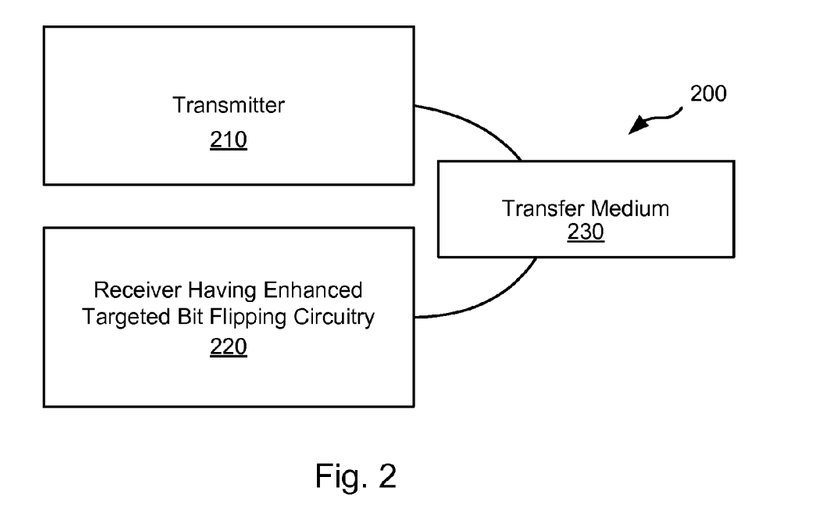
FIG. 2 shows a data transmission device including a receiver having enhanced targeted bit flipping circuitry in accordance with one or more embodiments of the present invention.

Turning to FIG. 2, a data transmission system 200 including a receiver 220 having enhanced targeted bit flipping circuitry in accordance with one or more embodiments of the present invention. A transmitter 210 transmits encoded data via a transfer medium 230 as is known in the art. The encoded data is received from transfer medium 230 by receiver 220.

In operation, data received by receiver 220 is processed using a standard processing approach. Where the standard processing approach fails to converge (i.e., yield the originally stored data set), a retry process is performed. The retry process includes flipping symbols within a failed output to yield a modified output, and reprocessing the modified output using the standard processing approach. Initially, each possibility for each symbol connected to an unsatisfied check of the failed output is modified one at a time followed by reprocessing. Where this repeated reprocessing fails to converge, a subset of the possibilities for each symbol not connected to an unsatisfied check along with respective modifications of each possibility for each symbol connected to an unsatisfied check of the failed output are tried. This process continues until either the failed output converges, or all of the possible combinations of valid symbols unconnected with unsatisfied checks and symbols connected with unsatisfied checks are tested. The data processing circuit may be implemented similar to that discussed below in relation to FIGS. 4a-4b. The data processing may be completed using a method such as that discussed in relation to FIGS. 5a-5b and 6.

Figure 3:
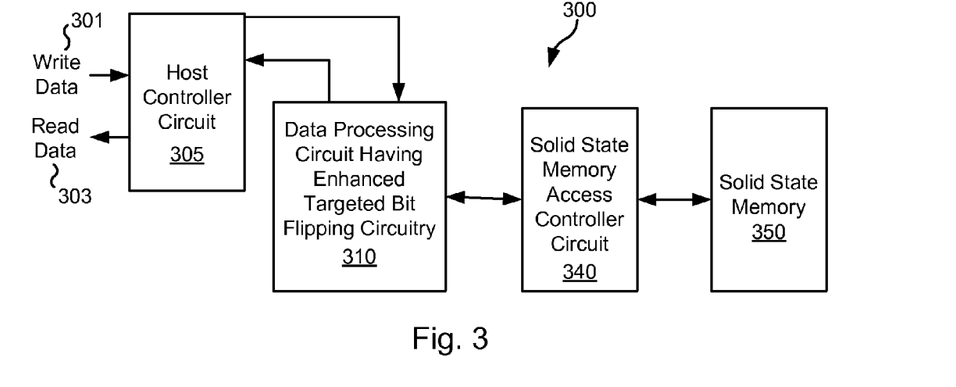
FIG. 3 shows a solid state memory circuit including a data processing circuit enhanced targeted bit flipping circuitry in accordance with some embodiments of the present invention.

Turning to FIG. 3, another storage system 300 is shown that includes a data processing circuit 310 enhanced targeted bit flipping circuitry in accordance with one or more embodiments of the present invention. A host controller circuit 305 receives data to be stored (i.e., write data 301). Solid state memory access controller circuit 340 may be any circuit known in the art that is capable of controlling access to and from a solid state memory. Solid state memory access controller circuit 340 formats the received encoded data for transfer to a solid state memory 350. Solid state memory 350 may be any solid state memory known in the art. In some embodiments of the present invention, solid state memory 350 is a flash memory. Later, when the previously written data is to be accessed from solid state memory 350, solid state memory access controller circuit 340 requests the data from solid state memory 350 and provides the requested data to data processing circuit 310. In turn, data processing circuit 310 applies a standard processing approach to the received data. Where the standard processing approach fails to converge (i.e., yield the originally stored data set), a retry process is performed. The retry process includes flipping symbols within a failed output to yield a modified output, and reprocessing the modified output using the standard processing approach. Initially, each possibility for each symbol connected to an unsatisfied check of the failed output is modified one at a time followed by reprocessing. Where this repeated reprocessing fails to converge, a subset of the possibilities for each symbol not connected to an unsatisfied check along with respective modifications of each possibility for each symbol connected to an unsatisfied check of the failed output are tried. This process continues until either the failed output converges, or all of the possible combinations of valid symbols unconnected with unsatisfied checks and symbols connected with unsatisfied checks are tested. The data processing circuit may be implemented similar to that discussed below in relation to FIGS. 4a-4b. The data processing may be completed using a method such as that discussed in relation to FIGS. 5a-5b and 6.

Figure 4A:
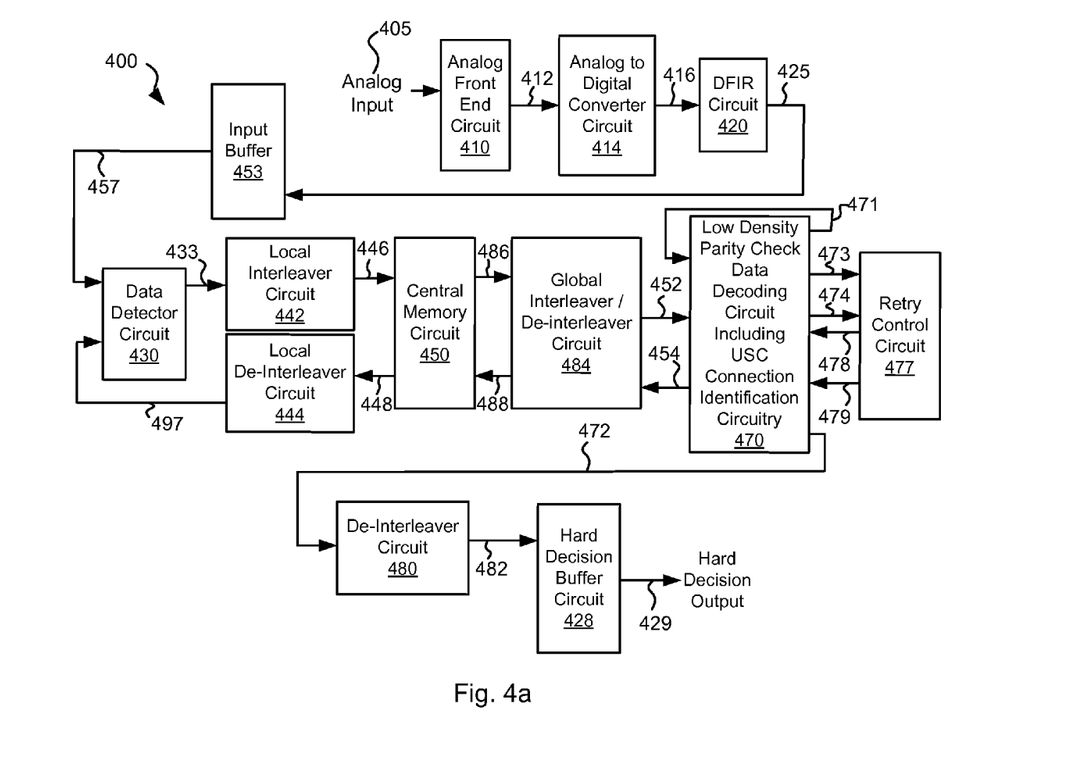
FIGS. 4a-4b shows a data processing system including a retry control circuit in accordance with various embodiments of the present invention.

Turning to FIG. 4a, a data processing system 400 including a retry control circuit 477 in accordance with various embodiments of the present invention. Data processing system 400 includes an analog front end circuit 410 that receives an analog signal 405. Analog front end circuit 410 processes analog signal 405 and provides a processed analog signal 412 to an analog to digital converter circuit 414. Analog front end circuit 410 may include, but is not limited to, an analog filter and an amplifier circuit as are known in the art. Based upon the disclosure provided herein, one of ordinary skill in the art will recognize a variety of circuitry that may be included as part of analog front end circuit 410. In some cases, analog signal 405 is derived from a read/write head assembly (not shown) that is disposed in relation to a storage medium (not shown). In other cases, analog signal 405 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 405 may be derived.

Analog to digital converter circuit 414 converts processed analog signal 412 into a corresponding series of digital samples 416. Analog to digital converter circuit 414 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 416 are provided to an equalizer circuit 420. Equalizer circuit 420 applies an equalization algorithm to digital samples 416 to yield an equalized output 425. In some embodiments of the present invention, equalizer circuit 420 is a digital finite impulse response filter circuit as are known in the art. It may be possible that equalized output 425 may be received directly from a storage device in, for example, a solid state storage system. In such cases, analog front end circuit 410, analog to digital converter circuit 414 and equalizer circuit 420 may be eliminated where the data is received as a digital data input. Equalized output 425 is stored to an input buffer 453 that includes sufficient memory to maintain a number of codewords until processing of that codeword is completed through a data detector circuit 430 and low density parity check (LDPC) decoding circuit 470 including, where warranted, multiple global iterations (passes through both data detector circuit 430 and LDPC decoding circuit 470) and/or local iterations (passes through LDPC decoding circuit 470 during a given global iteration). An output 457 is provided to data detector circuit 430.

Data detector circuit 430 may be a single data detector circuit or may be two or more data detector circuits operating in parallel on different codewords. Whether it is a single data detector circuit or a number of data detector circuits operating in parallel, data detector circuit 430 is operable to apply a data detection algorithm to a received codeword or data set. In some embodiments of the present invention, data detector circuit 430 is a Viterbi algorithm data detector circuit as are known in the art. In other embodiments of the present invention, data detector circuit 430 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 430 is used to apply the data detection algorithm to the received codeword for a first global iteration applied to the received codeword, and another data detector circuit included in data detector circuit 430 is operable apply the data detection algorithm to the received codeword guided by a decoded output accessed from a central memory circuit 450 on subsequent global iterations.

Upon completion of application of the data detection algorithm to the received codeword on the first global iteration, data detector circuit 430 provides a detector output 433. Detector output 433 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 433 is provided to a local interleaver circuit 442. Local interleaver circuit 442 is operable to shuffle sub-portions (i.e., local chunks) of the data set included as detected output and provides an interleaved codeword 446 that is stored to central memory circuit 450. Interleaver circuit 442 may be any circuit known in the art that is capable of shuffling data sets to yield a re-arranged data set. Interleaved codeword 446 is stored to central memory circuit 450.

Once LDPC decoding circuit 470 is available, a previously stored interleaved codeword 446 is accessed from central memory circuit 450 as a stored codeword 486 and globally interleaved by a global interleaver/de-interleaver circuit 484. Global interleaver/de-interleaver circuit 484 may be any circuit known in the art that is capable of globally rearranging codewords. Global interleaver/De-interleaver circuit 484 provides a decoder input 452 into LDPC decoding circuit 470. LDPC decoding circuit 470 applies an LDPC data decode algorithm to decoder input 452 to yield a decoded output 471. In cases where another local iteration (i.e., another pass through LDPC decoding circuit 470) is desired, LDPC decoding circuit 470 re-applies the data decode algorithm to decoder input 452 guided by decoded output 471. This continues until either a maximum number of local iterations is exceeded or decoded output 471 converges (i.e., completion of standard processing).

Where decoded output 471 fails to converge (i.e., fails to yield the originally written data set) and a number of local iterations through LDPC decoding circuit 470 exceeds a threshold, but an allowable number of global iterations is not yet exceeded, the resulting decoded output is provided as a decoded output 454 back to central memory circuit 450 where it is stored awaiting another global iteration through a data detector circuit included in data detector circuit 430. Prior to storage of decoded output 454 to central memory circuit 450, decoded output 454 is globally de-interleaved to yield a globally de-interleaved output 488 that is stored to central memory circuit 450. The global de-interleaving reverses the global interleaving earlier applied to stored codeword 486 to yield decoder input 452. When a data detector circuit included in data detector circuit 430 becomes available, a previously stored de-interleaved output 488 is accessed from central memory circuit 450 and locally de-interleaved by a de-interleaver circuit 444. De-interleaver circuit 444 re-arranges decoder output 448 to reverse the shuffling originally performed by interleaver circuit 442. A resulting de-interleaved output 497 is provided to data detector circuit 430 where it is used to guide subsequent detection of a corresponding data set previously received as equalized output 425.

Alternatively, where the decoded output converges (i.e., yields the originally written data set), the resulting decoded output is provided as an output codeword 472 to a de-interleaver circuit 480 that rearranges the data to reverse both the global and local interleaving applied to the data to yield a de-interleaved output 482. De-interleaved output 482 is provided to a hard decision buffer circuit 428 buffers de-interleaved output 482 as it is transferred to the requesting host as a hard decision output 429.

As yet another alternative, where decoded output 471 fails to converge (i.e., fails to yield the originally written data set), a number of local iterations through LDPC decoding circuit 470 exceeds a threshold, and a number of global iterations through data detector circuit 430 and LDPC data decoding circuit 470 exceeds a threshold, the result of the last pass through LDPC decoding circuit 470 is provided as a decoded output 474 to retry control circuit 477. LDPC decoding circuit 470 is operable to identify all unsatisfied checks (USCs) in decoded output 474. These USCs are failed parity check equations and there are a number of symbols that play a part in each of the failed parity check equations. LDPC decoding circuit 470 identifies all of the symbols that play a part in each of the USCs (i.e., USC connected symbols) and reports a list of the connected symbols as a USC connected symbol output 473 that is provided to retry control circuit 473.

Retry control circuit 477 systematically flips elements of both USC connected symbols 473, and non-USC connected symbols, and reports a modified decoded output 479 including the flipped elements back to LDPC decoding circuit 470 along with a retry start 478 indication to perform the data processing guided by the modified decoded output 479. The number of global iterations and local iterations performed are reset, and the previously described processing (both global and local iterations) is re-applied to a detected output 433 corresponding to modified decoded output 479 in an attempt to achieve convergence. Where the resulting decoded output still fails to converge, retry control circuit 477 sets the decoded output back to the state at the end of the original processing, and flips other elements before restarting the processing using the newly modified decoded output. This process continues until either the codeword converges, or all possible combinations of elements to be flipped are exhausted.

Retry control circuit 477 limits the elements that are to be flipped to one of the following two conditions: (1) all elements of USC connected symbols, and a reduced subset of the elements of non-USC connected symbols; and (2) a reduced subset of the elements of USC connected symbols, and a reduced subset of the elements of non-USC connected symbols. The aforementioned reduced subset of the elements of a given symbol is obtained by comparing the soft data (i.e., log likelihood ratio (LLR) data) of non-selected bit combinations of a symbol to an upper threshold and a lower threshold. Only bit combinations within the upper threshold and the lower threshold are included in the reduced subset of the elements.

As an example using a two bit symbol where the upper threshold is four (4) and the lower threshold is zero (0), the symbol in the following table yields three possible elements to be flipped.

| Hard Decision | LLR for Offset 01 | LLR for Offset 10 | LLR for Offset 11 |
|---|---|---|---|
| 01 | 2 | 10 | 0 |

In particular, the elements corresponding to the hard decision, offset 01, and offset 11 are included in the reduced subset of elements. Element 10 is eliminated. The offsets provide a mechanism for identifying other symbol values based upon the hard decision symbol value. In particular, binary addition is used to add the hard decision to the offset to yield the bit values corresponding to the offset. Using the example above, the bit values corresponding to LLR offset 01 are '00' (i.e., '01' binary added to '01'), the bit values corresponding to LLR offset 10 are '11' (i.e., '10' binary added to '01'), and the bit values corresponding to LLR offset 11 are '10' (i.e., '11' binary added to '01'). The reduced subset of elements includes: (1) the hard decision with the LLR values for the other elements saturated (i.e., set to a maximum value), (2) the bit values corresponding to LLR offset 01 with the LLR values for the other elements saturated, and (3) the bit values corresponding to LLR offset 11 with the LLR values for the other elements saturated. The following table shows the three possible symbol flips that may be chosen by retry control circuit 477. Of note, the table indicating "Hard Decision" '01' (i.e., the '00' offset) is chosen only if at least one of the other offsets (i.e., at least one of the other soft data values) are within the thresholds, and none of the other offsets is below the lower threshold.

| Hard Decision | LLR for Offset 01 | LLR for Offset 10 | LLR for Offset 11 |
|---|---|---|---|
| 00 | MAX | MAX | MAX |
| 01 | MAX | MAX | MAX |
| 10 | MAX | MAX | MAX |

As another example using a two bit symbol where the upper threshold is four (4) and the lower threshold is two (2), the symbol in the following table yields only one possible elements to be flipped.

| Hard Decision | LLR for Offset 01 | LLR for Offset 10 | LLR for Offset 11 |
|---|---|---|---|
| 01 | 2 | 10 | 0 |

In particular, only the elements corresponding to the LLR offset 01 are included in the reduced subset of elements, and all other elements are eliminated. The following table shows the possible symbol flip that may be chosen by retry control circuit 477.

| Hard Decision | LLR for Offset 01 | LLR for Offset 10 | LLR for Offset 11 |
|---|---|---|---|
| 00 | MAX | MAX | MAX |

As yet another example using a two bit symbol where the upper threshold is four (4) and the lower threshold is two (0) and the symbol is set forth in the following table, no possible symbols are included in the reduced subset of elements.

| Hard Decision | LLR for Offset 01 | LLR for Offset 10 | LLR for Offset 11 |
|---|---|---|---|
| 01 | 6 | 10 | 8 |

In such a case, this symbol is not modified in any of the repeated retry processes controlled by retry control circuit 477.

The following pseudocode represents the operation of data processing circuit where non-USC connected symbols are reduced before flipping, and all possibilities of USC connected symbols are used for flipping.

```
Set Failure to Converge to TRUE;
For (i = 0 to Maximum Global Iterations){ /* Apply Initial Global Iterations */
    apply data detection to codeword guided by a current decoded output where available to
yield a detected output;
    For (j = 0 to Maximum Local Iterations){ /* Apply Local Iterations of Decoding Process */
        apply data decoding to the detected output guided by a current decoded output where
available to yield a decoded output;
        set the decoded output to be the current decoded output;
        If (decoded output converged){
            provide decoded output as data output;
            set j equal to Maximum Local Iterations plus one; /*force process to end*/
            set i equal to Maximum Global Iterations plus one; /*force process to end*/
            set Failure to Converge to FALSE
        } /*close if converged process*/
    }/*close local iterations process*/
}/* close global iterations process*/
For each USC connected symbol {
    If (Failure to Converge == TRUE){
        For each element of the current USC connected symbol {
            modify the element of the current USC connected symbol to yield a modified decoded
output;
            For (i = 0 to Maximum Global Iterations){/*Apply USC Connected Global Iterations*/
                apply data detection to the codeword guided by the modified decoded output where
to yield a detected output;
                For (j = 0 to Maximum Local Iterations){ /* Apply Local Iterations */
                    apply data decoding to the detected output guided by a current decoded output
where available to yield a decoded output;
                    set the decoded output to be the current decoded output;
                    If (decoded output converged){
                        provide decoded output as data output;
                        set j equal to Maximum Local Iterations plus one; /*force process to end*/
                        set i equal to Maximum Global Iterations plus one /*force process to end*/
                        set Failure to Converge to FALSE
                    }/*close if converged process*/
                }/*close local iterations process*/
            }/* close global iterations process*/
        }/*close each element of the current USC connected symbol process*/
    }/* close if Failure to Converge process*/
}/* close each element of USC connected symbol process*/
For each non-USC connected symbol {
    If (Failure to Converge == TRUE){
        identify reduced subset of the elements of the non-USC connected symbol;
        For each element of the reduced subset of the elements {
            modify the element of the current non-USC connected symbol to yield a modified
decoded output;
            For each element of the current USC connected symbol {
                modify the element of the current USC connected symbol to further modify the
modified decoded output;
                For (i = 0 to Maximum Global Iterations){/*Apply Combination Global Its*/
                    apply data detection to the codeword guided by the modified decoded output
where to yield a detected output;
                    For (j = 0 to Maximum Local Iterations){ /* Apply Local Iterations */
                        apply data decoding to the detected output guided by a current decoded
output where available to yield a decoded output;
                        set the decoded output to be the current decoded output;
                        If (decoded output converged){
                            provide decoded output as data output;
                            set j equal to Maximum Local Iterations plus one; /*force process end*/
                            set i equal to Maximum Global Iterations plus one /*force process end*/
                            set Failure to Converge to FALSE
                        } /*close if converged process*/
                    } /*close local iterations process*/
                } /*close global iterations process*/
            }/* close each element of the current USC connected symbol process*/
        } /*close each element of the reduced subset of the elements process */
    } /*close if Failure to Converge process*/
} /*close each non-USC connected symbol process*/
```

The aforementioned pseudocode may be modified to represent the operation of data processing circuit where non-USC connected symbols are reduced before flipping, and the USC connected symbols are reduced before flipping by adding the reduction process (i.e., identify reduced subset of the elements of the USC connected symbol) before performing the flipping for each USC connected symbol.

Figure 4B:
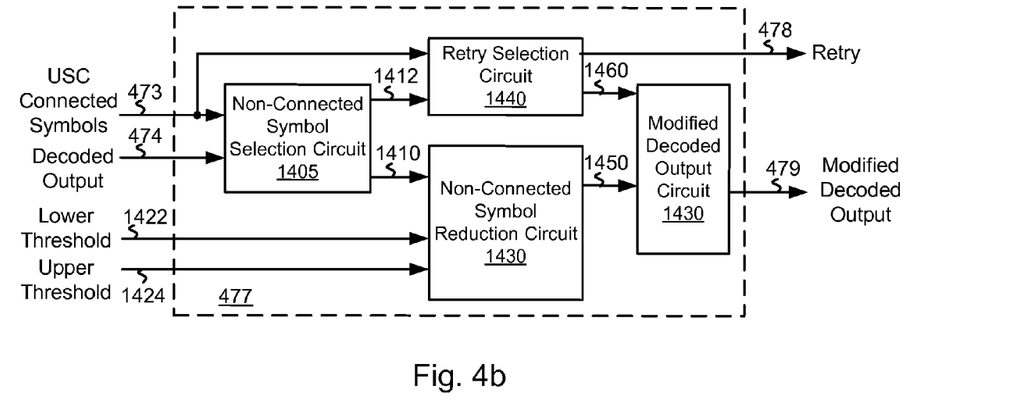

Turning to FIG. 4b, one implementation of retry control circuit 477 is shown in accordance with some embodiments of the present invention. As shown, a non-connected symbol selection circuit 1405 receives USC connected symbols 473 and decoded output 474; and selects all of the symbols in decoded output 474 that are not included in USC connected symbols 473 as non-connected USC symbols. These non-connected USC symbols are provided as an output 1412 to a retry selection circuit 1440 and as an output 1410 to a non-connected symbol reduction circuit 1430. Non-connected symbol reduction circuit 1430 compares the soft data in each of the symbols of output 1410 to an upper threshold 1424 and a lower threshold 1422. Each set of soft data within the range of lower threshold 1422 to upper threshold 1424 are selected for possible bit flipping with the soft data for each of the non-selected bit values being saturated as discussed above in relation to FIG. 4*a*. The reduced subset of elements are provided as an output 1450 to a modified decoded output circuit 1430.

Retry selection circuit 1440 selects combinations of USC connected symbols 473 and output 1412 (i.e., non-USC connected symbols) as possible combinations 1460 of flipped symbols, and provides retry output 478. Modified decoded output circuit 1430 systematically modifies decoded output 474 to flip bits for reprocessing and provides the result as modified decoded output 479. In particular, modified decoded output circuit 1430 selects one possible bit combination for a first USC connected input 474, flips the bits within decoded output 474 to correspond to the selected bit combination, and allows for the data processing to operate on the resulting modified decoded output 479. Where this fails to yield a converged codeword, modified decoded output circuit 1430 reverts to the decoded output available at the end of the non-retry processing, selects another possible bit combination for the first USC connected input 474, flips the bits within decoded output 474 to correspond to the selected bit combination, and allows for the data processing to operate on the resulting modified decoded output 479. This process continues until either the codeword converges or all possible combinations for the first USC connected input are tried. The process is then repeated for each of the other USC connected inputs until either convergence is achieved or all possible bit value combinations for each of the USC connected inputs are individually tested.

Where none of the combinations of bit values for the symbols of USC connected input 474 result in convergence, then the same symbols of USC connected input 474 are flipped in conjunction with one of the reduced subset of elements are provided as output 1450. In particular, modified decoded output circuit 1430 reverts to the decoded output available at the end of the non-retry processing. In addition, modified decoded output circuit 1430 modifies a first non-USC connected symbol to be a first of the elements of the reduced subset of elements and further modifies the modified decoded output to reflect one possible bit combination for a first USC connected input 474, and allows for the data processing to operate on the resulting modified decoded output 479. Where this fails to yield a converged codeword, modified decoded output circuit 1430 re-modifies the first USC connected input 474 to another possible bit combination for the first USC connected input 474, and allows for the data processing to operate on the resulting modified decoded output 479. This process continues until either the codeword converges or all possible combinations for each of the USC connected inputs are tried in relation to the modified state of the first non-USC connected input.

Where none of the combinations of bit values for the first non-USC connected input and USC connected inputs, respectively, fail to result in convergence, the process is repeated for the next non-USC connected input in relation to the respective USC connected inputs. This process of combining allowed bit values (i.e., bit values represented in the reduced subset of elements for the respective non-USC connected input) with all combinations of bit values for each of the USC connected inputs is continued for each non-USC connected input until either convergence occurs or all non-USC connected inputs have been tested. Where convergence does not occur before all possibilities are exhausted, the retry process ends in an error condition.

Figure 5A:
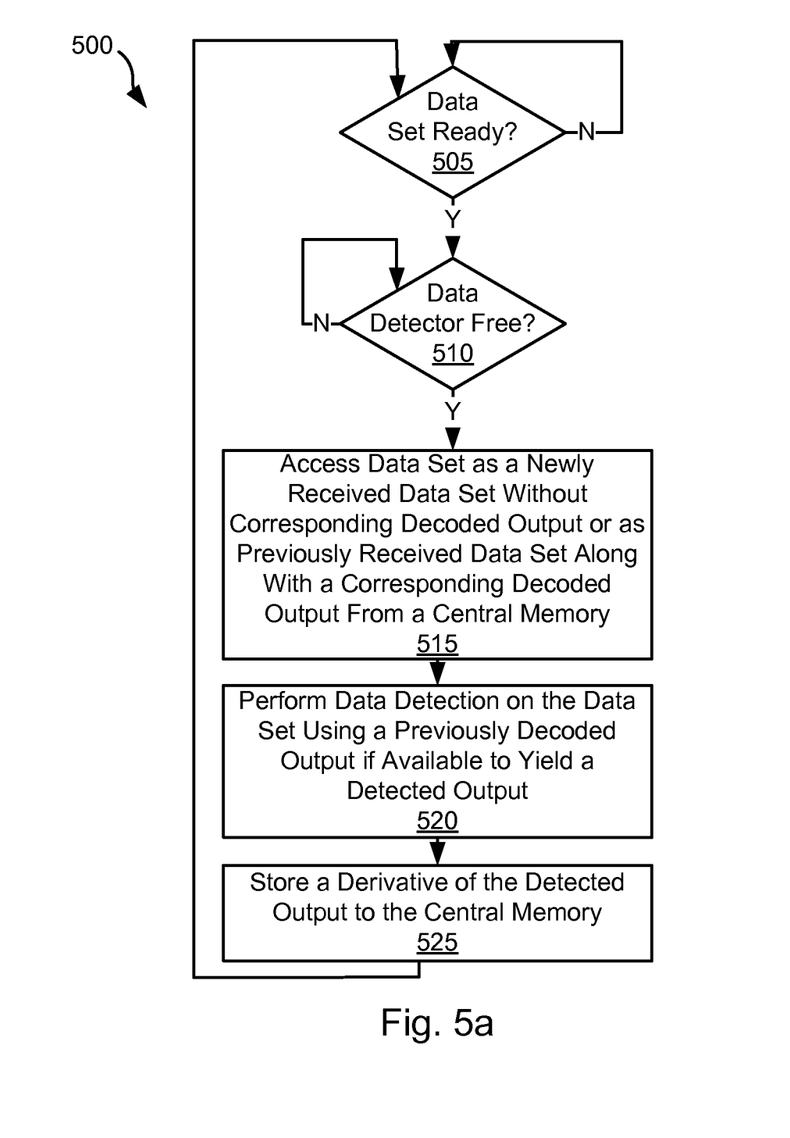
FIGS. 5a-5b are flow diagrams showing a method for data processing in accordance with some embodiments of the present invention.

Turning to FIG. 5*a*, a flow diagram 500 shows a method for data processing including data detection that may be used in relation to one or more embodiments of the present invention. Following flow diagram 500, it is determined whether a data set or codeword is ready for application of a data detection algorithm (block 505). In some cases, a data set is ready when it is received from a data decoder circuit via a central memory circuit. In other cases, a data set is ready for processing when it is first made available from a front end processing circuit. Where a data set is ready (block 505), it is determined whether a data detector circuit is available to process the data set (block 510).

Where the data detector circuit is available for processing (block 510), the data set is accessed by the available data detector circuit (block 515). The data detector circuit may be, for example, a Viterbi algorithm data detector circuit or a maximum a posteriori data detector circuit. Where the data set is a newly received data set (i.e., a first global iteration), the newly received data set is accessed. In contrast, where the data set is a previously received data set (i.e., for the second or later global iterations), both the previously received data set and the corresponding decode data available from a preceding global iteration (available from a central memory) is accessed. The accessed data set is then processed by application of a data detection algorithm to the data set (block 520). Where the data set is a newly received data set (i.e., a first global iteration), it is processed without guidance from decode data available from a data decoder circuit. Alternatively, where the data set is a previously received data set (i.e., for the second or later global iterations), it is processed with guidance of corresponding decode data available from preceding global iterations. Application of the data detection algorithm yields a detected output. A derivative of the detected output is stored to the central memory (block 525). The derivative of the detected output may be, for example, an interleaved or shuffled version of the detected output.

Figure 5B:
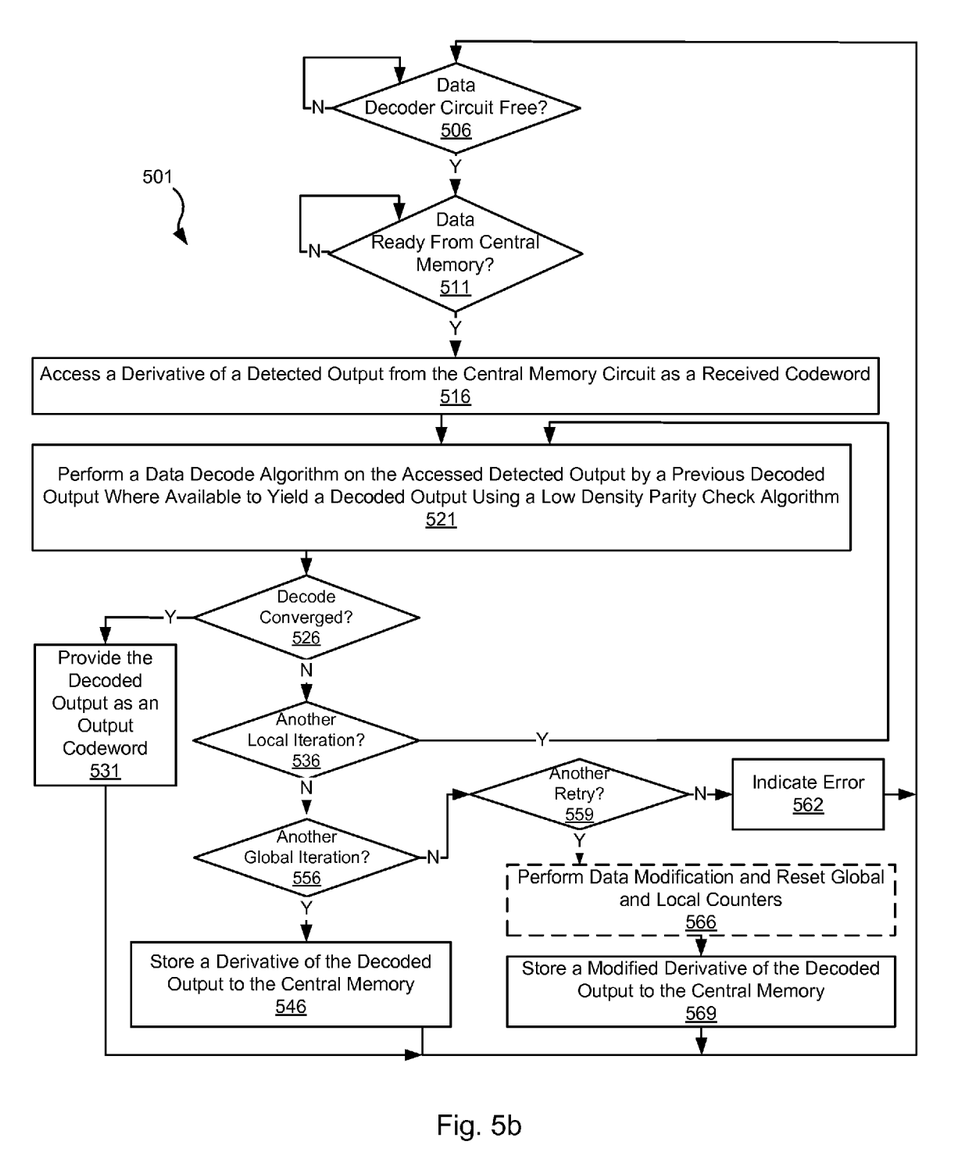

Turning to FIG. 5*b*, a flow diagram 501 shows a counterpart of the method described above in relation to FIG. 5*a*. Following flow diagram 501, in parallel to the previously described data detection process of FIG. 5*a*, it is determined whether a data decoder circuit is available (block 506). The data decoder circuit may be a low density data decoder circuit in accordance with one or more embodiments of the present invention. Where the data decoder circuit is available (block 506), it is determined whether a derivative of a detected output is available for processing in the central memory (block 511). Where such a data set is ready (block 511), the previously stored derivative of a detected output is accessed from the central memory and used as a received codeword (block 516). A low density parity check algorithm is applied to the received codeword to yield a decoded output (block 521). Where a previous local iteration has been performed on the received codeword, the results of the previous local iteration (i.e., a previous decoded output) are used to guide application of the decode algorithm.

It is determined whether the decoded output converged (i.e., resulted in the originally written data) (block 526). Where the decoded output converged (block 526), it is provided as an output codeword (block 531). Alternatively, where the decoded output failed to converge (block 526), it is determined whether another local iteration is desired (block 536). In some cases, ten local iterations are allowed per each global iteration. Based upon the disclosure provided herein, one of ordinary skill in the art will recognize another number of local iterations that may be used in relation to different embodiments of the present invention. Where another local iteration is desired (block 536), the processes of blocks 506-

536 are repeated for the codeword. Alternatively, where another local iteration is not desired (block 536), it is determined whether another global iteration is desired (block 556). Where another global iteration is desired (block 556), a derivative of the decoded output is stored to the central memory to await reprocessing using the data detection algorithm as discussed in relation to FIG. 5a (block 546).

Alternatively, where another global iteration is not desired (block 556), it is determined if another retry is desired (block 559). In some cases, a number of combinations of targeted bit modifications in the decoded output are done followed by retry processing using the processes discussed in relation to FIGS. 5a-5b. Where another retry is desired (block 559), data modification in the decoded output is performed along with resetting all local and global iteration counters to allow for reprocessing of the modified decoded output (block 566). In such a case, a derivative of the modified decoded output is stored to the central memory to await reprocessing using the data detection algorithm as discussed in relation to FIG. 5a (block 569). Alternatively, where another retry is not desired (block 559), an error is indicated (block 562).

Figure 6:
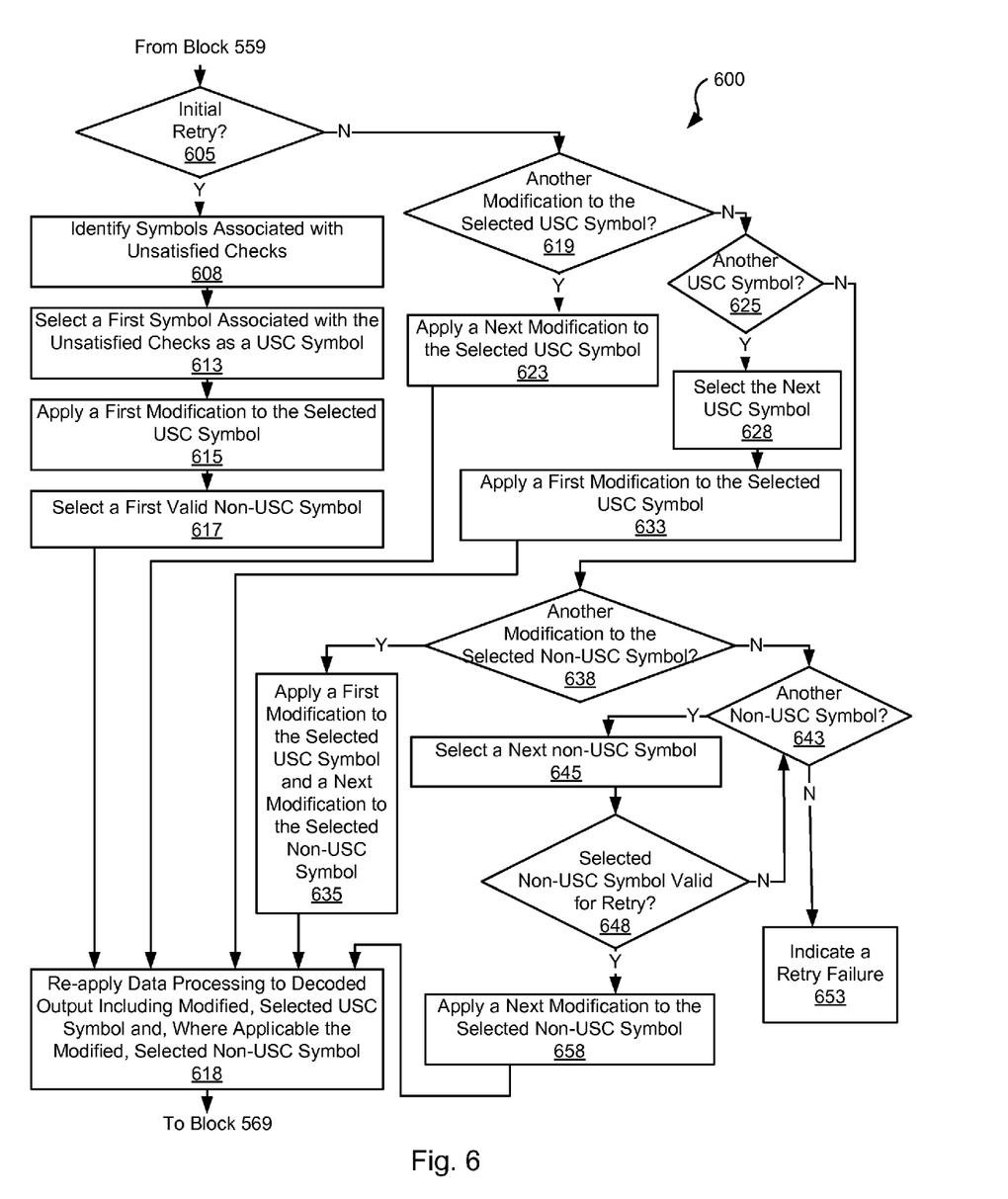
FIG. 6 shows a flow diagram showing a method for targeted bit flipping in accordance with various embodiments of the present invention.

Block 569 is shown in dashed lines as one implementation of block 569 is shown in FIG. 6. The modification is systematically performed until either convergence occurs (block 526) are all allowable combinations of targeted bit modification are retried in which case an error is indicated (block 562). In some cases, one possible bit combination for a first USC connected symbol is selected, bits within the decoded output corresponding to the selected bit combination are modified, and the data processing of FIGS. 5a-5b are repeated for the modified decoded output. Where this fails to yield a converged codeword, the modified decoded output is reverted to the decoded output available at the end of the non-retry processing, another possible bit value combination for the first USC connected symbol is selected, the bits within the decoded output corresponding to the selected bit combination are modified, and the data processing of FIGS. 5a-5b is performed again on the newly modified decoded output. This process continues until either the codeword converges or all possible combinations for the first USC connected symbol are tried. The process is then repeated for each of the other USC connected symbols until either convergence is achieved or all possible bit value combinations for each of the USC connected symbols are individually tested.

Where none of the combinations of bit values for the symbols of the USC connected symbols result in convergence, then the same USC connected symbols are modified in conjunction with one of a reduced subset of elements of non-USC connected symbols. In particular, the modified decoded output circuit is reverted to the decoded output available at the end of the non-retry processing. A first non-USC connected symbol in the decoded output is modified to be a first of the elements of the reduced subset of elements and a first USC connected symbol in the decoded output is modified to reflect one possible bit combination for the first USC connected symbol, and the data processing of FIGS. 5a-5b is performed again on the newly modified decoded output. Where this fails to yield a converged codeword, the first USC connected symbol is re-modified to correspond to another possible bit combination for the first USC connected symbol, and the data processing of FIGS. 5a-5b is performed again on the newly modified decoded output. This process continues until either the codeword converges or all possible combinations for each of the USC connected symbols are tried in relation to the modified state of the first non-USC connected symbol.

Where none of the combinations of bit values for the first non-USC connected symbol and USC connected symbols, respectively, fail to result in convergence, the process is repeated for the next non-USC connected symbol in relation to the respective USC connected symbols. This process of combining allowed bit values (i.e., bit values represented in the reduced subset of elements for the respective non-USC connected symbol) with all combinations of bit values for each of the USC connected inputs is continued for each non-USC connected symbol until either convergence occurs or all non-USC connected symbols have been tested. Where convergence does not occur before all possibilities are exhausted, the retry process ends in error condition (block 562).

Turning to FIG. 6, a flow diagram 600 shows a method for targeted bit flipping in accordance with various embodiments of the present invention. As mentioned above, flow diagram 600 may be use in place of block 566 of FIG. 5b in accordance with some embodiments of the present invention. Following flow diagram 600, it is determined if this retry is an initial retry after a failed standard processing (block 605). Where it is an initial retry (block 605), symbols associated with unsatisfied checks (USCs) in the decoded output that resulted from the standard processing are identified (block 608). The identified symbols are any symbols associated with a failed parity check equation. A first symbol of the symbols identified as associated with the USCs is selected (block 613), and a first modification is applied to the symbol within the decoded output (block 615). In some embodiments of the present invention, the modification to the symbol in the decoded output may be any of the possible bit combinations for the symbol. In other embodiments of the present invention, the modifications to the symbol in the decoded output are limited to bit values that correspond to soft data within a defined range. In addition, a first value non-USC connected symbol is selected (block 617). A valid non-USC connected symbol is any non-USC connected symbol that includes one or more combinations of bit values corresponding to a defined range of soft data values. The data processing of blocks 5a-5b is then re-applied to the modified decoded output (block 618).

Alternatively, where it is not the initial retry (block 605), it is determined whether there is another possible modification to the currently selected USC connected symbol (block 619). Where there is another possible modification to the currently selected USC connected symbol (block 619), the next modification is applied to the symbol in the decoded output (block 623), and the data processing of blocks 5a-5b is then re-applied to the newly modified decoded output (block 618).

Alternatively where no more possible modifications remain for the currently selected USC connected symbol remain (block 619), it is determined whether another USC selected symbol remains to be tested (block 625). Where another USC selected symbol remains to be tested (block 625), the previously tested USC symbol in the decoded output is flipped back to its value existing at the end of standard processing, and the next USC connected symbol is selected (block 628). A first modification is applied to the newly selected USC connected symbol in the decoded output (block 633), and the data processing of blocks 5a-5b is then re-applied to the newly modified decoded output (block 618).

Alternatively, where no additional USC connected symbols remain for testing (block 625), it is determined whether other modifications of the currently selected non-USC connected symbol remain to be tested (block 638). Where another modification remains to be tested (block 638), a first modification is applied to the currently selected USC connected symbol in the decoded output, and a next valid modification is applied to the currently selected non-USC connected symbol in the decoded output (block 635). The data processing of blocks 5a-5b is then re-applied to the newly modified decoded output (block 618).

Alternatively, where no additional modifications of the currently selected non-USC connected symbol remain to be tested (block 638), it is determined whether another non-USC connected symbol remains to be tested (block 643). Where no more non-USC connected symbols remain to be tested (block 643), a retry failure is indicated (block 653). Otherwise where another non-USC connected symbol remains to be tested (block 643), the next non-USC connected symbol is selected (block 645), and it is determined whether the selected non-USC symbol is valid for retry (block 648). Again, a valid non-USC connected symbol is any non-USC connected symbol that includes one or more combinations of bit values corresponding to a defined range of soft data values. Where the selected non-USC connected symbol is not valid (block 648), the processes beginning at block 643 start again. Alternatively, where the selected non-USC connected symbol is valid (block 648), a next modification is applied to the selected non-USC symbol in the decoded output (block 658), and the data processing of blocks 5a-5b is then re-applied to the newly modified decoded output (block 618).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system comprising:
   a data processing circuit operable to apply a data processing algorithm to a data input to yield a decoded output, wherein the decoded output includes a number of symbols, and wherein each of the symbols includes at least a first soft data value associated with a first bit combination and a second soft data value associated with a second bit combination;
   a retry control circuit operable to:
      receive an indication that a symbol is connected to an unsatisfied parity check equation;
      select the symbol in the decoded output, wherein the selection is made in part based upon the indication that the symbol is connected to the unsatisfied parity check equation;
      determine a reduced subset of the first bit combination and the second bit combination for the selected symbol based at least in part on the first soft data value and the second soft data value; and
      cause re-application of the data processing algorithm to the data input guided by the decoded output modified to include one of the reduced subset of the first bit combination or the second bit combination.

2. The data processing system of claim 1, wherein the selected symbol is a first selected symbol, and wherein the retry control circuit is further operable to:
   cause re-application of the data processing algorithm to the data input guided by the decoded output modified to include the one of the reduced subset of the first bit combination or the second bit combination, and modified to include any possible bit combination of a second selected symbol.

3. The data processing system of claim 2, wherein the second selected symbol is not connected to an unsatisfied parity check equation in the decoded output.

4. The data processing system of claim 2, wherein re-application of the data processing algorithm is a first re-application of the data processing algorithm, and wherein the retry control circuit is further operable to:
   cause a second re-application of the data processing algorithm to the data input guided by the decoded output modified to include the one of the reduced subset of the first bit combination and the second bit combination, and modified to include another possible bit combination of the second selected symbol.

5. The data processing system of claim 1, wherein the retry control circuit includes a first comparator circuit and a second comparator circuit, and wherein determining the reduced subset of the first bit combination and the second bit combination for the selected symbol includes comparing the first soft data value against an upper threshold in the first comparator circuit and against a lower threshold in the second comparator circuit, and comparing the second soft data value against the upper threshold in the first comparator circuit and against the lower threshold in the second comparator circuit.

6. The data processing system of claim 5, wherein the first bit combination is included in the reduced subset of the first bit combination and the second bit combination when the first soft data is greater than the lower threshold and less than the upper threshold.

7. The data processing system of claim 5, wherein the second bit combination is excluded from the reduced subset of the first bit combination and the second bit combination when the second soft data is either greater than the upper threshold or less than the lower threshold.

8. The data processing system of claim 5, wherein the upper threshold is user programmable.

9. The data processing system of claim 5, wherein the lower threshold is user programmable.

10. The data processing system of claim 1, wherein the data processing circuit includes:
    a data detector circuit operable to apply a data detection algorithm to the data input to yield a detected output;
    a data decoder circuit operable to apply a data decode algorithm to a decoder input derived from the detected output to yield the decoded output; and
    wherein the data processing algorithm includes a combination of the data detection algorithm and the data decode algorithm.

11. The data processing system of claim 10, wherein the data decode algorithm is a low density parity check decode algorithm, and wherein the data detection algorithm is a maximum a posteriori data detection algorithm.

12. The data processing system of claim 1, wherein the data processing system is implemented as part of a device selected from a group consisting of: a communication device, and a storage device.

13. The data processing system of claim 1, wherein the data processing system is implemented as part of an integrated circuit.

14. A method for data processing, the method comprising:
applying a data processing algorithm to a data input by a data processing circuit to yield a decoded output, wherein the decoded output includes a number of symbols, and wherein each of the symbols includes at least a first soft data value associated with a first bit combination and a second soft data value associated with a second bit combination;
generating an indication that a symbol is connected to an unsatisfied parity check equation;
selecting the symbol in the decoded output, wherein the selection is made in part based upon the indication that the symbol is connected connection to the unsatisfied parity check equation;
determining a reduced subset of the first bit combination and the second bit combination for the selected symbol based at least in part on the first soft data value and the second soft data value; and
re-applying the data processing algorithm to the data input guided by the decoded output modified to include one of the reduced subset of the first bit combination or the second bit combination.

15. The method of claim 14, wherein determining the reduced subset of the first bit combination and the second bit combination for the selected symbol comprises:
comparing the first soft data value against an upper threshold and against a lower threshold; and
comparing the second soft data value against the upper threshold and against the lower threshold.

16. The method of claim 15, wherein the first bit combination is included in the reduced subset of the first bit combination and the second bit combination when the first soft data is greater than the lower threshold and less than the upper threshold, and wherein the first bit combination is excluded in the reduced subset of the first bit combination and the second bit combination when the first soft data is either greater than the upper threshold or less than the lower threshold.

17. The method of claim 14, wherein the selected symbol is a first selected symbol, and wherein the method further comprises:
re-applying the data processing algorithm to the data input guided by the decoded output modified to include the one of the reduced subset of the first bit combination or the second bit combination, and modified to include any possible bit combination of a second selected symbol.

18. The method of claim 17, wherein the second selected symbol is not connected to an unsatisfied parity check equation in the decoded output.

19. A storage device, the storage device comprising:
a storage medium;
a read/write head assembly disposed in relation to the storage medium;
a data processing circuit operable to apply a data processing algorithm to a data input derived from the read/write head assembly to yield a decoded output, wherein the decoded output includes a number of symbols, and wherein each of the symbols includes at least a first soft data value associated with a first bit combination and a second soft data value associated with a second bit combination;
a retry control circuit operable to:
receive an indication that a symbol is connected to an unsatisfied parity check equation;
select the symbol in the decoded output, wherein the selection is made in part based upon the indication that the symbol is connected to the unsatisfied parity check equation;
determine a reduced subset of the first bit combination and the second bit combination for the selected symbol based at least in part on the first soft data value and the second soft data value; and
cause re-application of the data processing algorithm to the data input guided by the decoded output modified to include one of the reduced subset of the first bit combination or the second bit combination.

20. The storage device of claim 19, wherein the selected symbol is a first selected symbol, and wherein the retry control circuit is further operable to:
cause re-application of the data processing algorithm to the data input guided by the decoded output modified to include the one of the reduced subset of the first bit combination or the second bit combination, and modified to include any possible bit combination of a second selected symbol.

* * * * *